United States Patent
Kozak et al.

(10) Patent No.: US 9,354,825 B2
(45) Date of Patent: May 31, 2016

(54) SOFTWARE DEVELOPMENT KIT FOR LIDAR DATA

(71) Applicant: PAR Technology Corporation, New Hartford, NY (US)

(72) Inventors: Mark J. Kozak, Deerfield, NY (US); Jimmy X. Wu, Rome, NY (US)

(73) Assignee: PAR TECHNOLOGY CORPORATION, New Hartford, NY (US)

( * ) Notice: Subject to any disclaimer, the term of this patent is extended or adjusted under 35 U.S.C. 154(b) by 156 days.

(21) Appl. No.: 14/178,812

(22) Filed: Feb. 12, 2014

(65) Prior Publication Data

US 2014/0229672 A1    Aug. 14, 2014

Related U.S. Application Data

(60) Provisional application No. 61/763,787, filed on Feb. 12, 2013.

(51) Int. Cl.
| | |
|---|---|
| *G06F 3/06* | (2006.01) |
| *H03M 7/46* | (2006.01) |
| *H03M 7/30* | (2006.01) |
| *H03M 7/40* | (2006.01) |
| *G01S 17/00* | (2006.01) |

(52) U.S. Cl.
CPC ............. *G06F 3/0689* (2013.01); *G01S 17/00* (2013.01); *G06F 3/0619* (2013.01); *G06F 3/0665* (2013.01); *H03M 7/30* (2013.01); *H03M 7/3084* (2013.01); *H03M 7/40* (2013.01); *H03M 7/46* (2013.01)

(58) Field of Classification Search
None
See application file for complete search history.

(56) References Cited

U.S. PATENT DOCUMENTS

| | | | |
|---|---|---|---|
| 7,373,473 B2 | 5/2008 | Bukowski | |
| 8,204,313 B2 | 6/2012 | Wheeler | |
| 2005/0071308 A1* | 3/2005 | Wedel | ............... G06F 17/30958 |
| 2010/0239178 A1 | 9/2010 | Osher | |
| 2011/0010400 A1 | 1/2011 | Hayes | |
| 2011/0202509 A1* | 8/2011 | He | ........................... H03M 7/30 |
| | | | 707/693 |
| 2011/0202538 A1 | 8/2011 | Salemann | |
| 2011/0216063 A1 | 9/2011 | Hayes | |
| 2012/0124113 A1 | 5/2012 | Zalik | |
| 2012/0150877 A1* | 6/2012 | Ramamurthy | .... G06F 17/30286 |
| | | | 707/752 |
| 2012/0290542 A1 | 11/2012 | Trotta et al. | |

(Continued)

FOREIGN PATENT DOCUMENTS

WO    2004036246    4/2004

OTHER PUBLICATIONS

International Search Report Form PCT/ISA/220, International Application No. PCT/US2014/015949, pp. 1-10, Dated May 22, 2014.

(Continued)

*Primary Examiner* — Idriss N Alrobaye
*Assistant Examiner* — Dayton Lewis-Taylor
(74) *Attorney, Agent, or Firm* — Bond Schoeneck & King, PLLC; George McGuire

(57) ABSTRACT

The present invention relates to a method and system for compressing and retrieving Light Detection and Ranging output data, and, more specifically, to a method and system for compressing Light Detection and Ranging output data by Run Length Encoding Light Detection and Ranging output data and rapidly accessing this compressed data which is filtered by attributes without the need to read or decompress the entire collection of data.

14 Claims, 5 Drawing Sheets

(56) References Cited

U.S. PATENT DOCUMENTS

2012/0313927 A1 12/2012 Curington
2013/0046471 A1 2/2013 Rahmes
2013/0086215 A1 4/2013 Trotta

OTHER PUBLICATIONS

Du, R., Lee, H.J., A Novel Compression Alogrithm for LiDAR Data, 5th International Congress on Image and Signal Processing, 2012, pp. 987-991.

Johnson, A.E., Manduchi, R., Probabilistic 3D Data Fusion for Adaptive Resolution Surface Generation, Proceedings of the First International Symposium on 3D Data Processing Visualization and Transmission, 2002.

Isenburg, M., LASzip: Lossless Compression of LiDAR Data; http://laszip.org.

Lipus, B., Zalik, B., Lossy LAS File Compression Using Uniform Space Division, Electronics Letters, 2012, vol. 48, No. 20.

Mongus, D., Spelic, D., Zalik, B., Rupnik, B., Geometry Compression of Scanned Point-Clouds, 2nd International Conference on Software Technology and Engineering, 2010, pp. V1-279-V1-282.

Wiman, H., Qin, Y., Fast Compression and Access of LiDAR Point Clouds Using Wavelets, Urban Remote Sensing Joint Event, 2009.

Zhang, Y., Li, X., Hua, D., Chen, H., Jin, H., An Lidar Data Compression Method Based on Improved LZW and Huffman Algorithm, International Conference on Electronics and Information Engineering, 2010, pp. V2-250-V2-254.

* cited by examiner

Fig. 1

```
typedef struct AGCL_PointBag {
        size_t   point_count;
        size_t   point_capacity;
        int32_t  *x;
        int32_t  *y;
        int32_t  *z;
        uint16_t *intensity;
        uint8_t  *return_number;         /* 3 bits */
        uint8_t  *number_of_returns;     /* 3 bits */
        uint8_t  *scan_direction_flag;   /* 1 bit  */
        uint8_t  *edge_of_flight;        /* 1 bit  */
        uint8_t  *classification;
        uint8_t  *scan_angle_rank;
        uint8_t  *user_data;
        uint16_t *point_source_id;
        double   *gps_time;
        uint16_t *red;
        uint16_t *green;
        uint16_t *blue;
        /*** LAS header info ***/
        AGCL_PBHeader pb_header;
} AGCL_PointBag;
```

Fig. 2

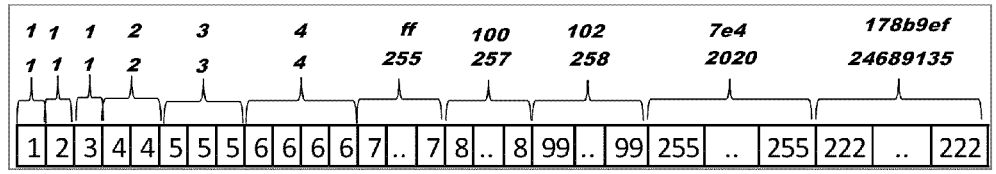
Fig. 3
| 1 | 2 | 3 | 4 | 4 | 0 | 5 | 5 | 1 | 6 | 6 | 2 | 7 | 7 | 253 | 8 | 8 | 255 | 99 | 99 | 1 | 99 | 0 | 255 | 255 | 7 | 255 | 226 |
| 222 | 222 | 1 | 222 | 120 | 222 | 185 | 222 | 237 |
Fig. 4
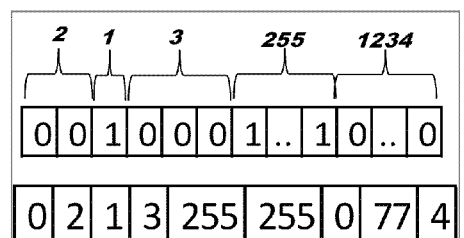
Fig. 5
| Floating Point | Integer |
|---|---|
| 334202.382960 | 334,202,382,960 |
Fig. 6
|  | Nibble 1 | Nibble 2 | Byte |
|---|---|---|---|
| Decimal | 8 | 3 | 131 |
| Hex | 8 | 3 | 83 |
Fig. 7

| Decimal | | HEX Delta values | | | | |
|---|---|---|---|---|---|---|
| 32 bit integer | Delta | 32 bits | Byte 3 | Byte 2 | Byte1 | Byte0 |
| 696800010 | | 2988530A | 29 | 88 | 53 | 0A |
| 696800311 | 301 | 12D | 0 | 0 | 1 | 2D |
| 696800611 | 300 | 12C | 0 | 0 | 1 | 2C |
| 696800914 | 303 | 12F | 0 | 0 | 1 | 2F |
| 696801214 | 300 | 12C | 0 | 0 | 1 | 2C |
| 696801517 | 303 | 12F | 0 | 0 | 1 | 2F |
| 696801818 | 301 | 12D | 0 | 0 | 1 | 2D |
| 696802123 | 305 | 131 | 0 | 0 | 1 | 31 |
| 696802430 | 307 | 133 | 0 | 0 | 1 | 33 |
| 696895459 | 93029 | 16B65 | 0 | 1 | 6B | 65 |

Fig. 8

| 29 | 0 | 0 | 0 | 0 | 0 | 0 | 0 | 88 | 0 | 0 | 0 | 0 | 0 | 0 | 0 | 1 | 53 | 1 | 1 | 1 | 1 | 1 | 1 | 1 | 6B | 0A | 2D | 2C | 2F | 2C | 2F | 2D | 31 | 33 | 65 |

Fig. 9

| Name | Size |
|---|---|
| 1-1-1 | 3 357 145 |
| 1-10-1 | 1 594 093 |
| 1-2-1 | 3 830 514 |
| 1-3-1 | 3 278 465 |
| 1-4-1 | 2 138 373 |
| 1-cloud | 8 |
| 2-1-1 | 3 305 637 |
| 2-10-1 | 752 292 |
| 2-2-1 | 3 749 054 |
| 2-3-1 | 3 307 490 |
| 2-4-1 | 2 132 143 |
| 2-cloud | 8 |
| 3-1-1 | 3 354 231 |
| 3-10-1 | 1 311 767 |
| 3-2-1 | 3 739 808 |
| 3-3-1 | 3 277 153 |
| 3-4-1 | 2 136 516 |
| 3-cloud | 8 |
| 4-1-1 | 3 324 765 |
| 4-10-1 | 824 794 |
| 4-2-1 | 3 821 551 |
| 4-3-1 | 3 278 607 |
| 4-4-1 | 2 134 342 |
| 4-cloud | 8 |
| 5-1-1 | 3 274 690 |
| 5-10-1 | 1 033 813 |
| 5-2-1 | 3 670 101 |
| 5-3-1 | 3 238 991 |
| 5-4-1 | 2 108 677 |
| 5-cloud | 8 |
| fields | 2 |
| m0 | 103 |

Fig. 10

SOFTWARE DEVELOPMENT KIT FOR LIDAR DATA

RELATED APPLICATION DATA

The present application claims the benefit of U.S. provisional patent application No. 61/763,787, filed Feb. 12, 2013, which is hereby incorporated by reference in its entirety.

BACKGROUND OF THE INVENTION

1. Field of the Invention

The present invention relates to a method and system for compressing and retrieving Light Detection and Ranging output data, and, more specifically, to a method and system for compressing Light Detection and Ranging output data by Run Length Encoding Light Detection and Ranging output data and rapidly accessing this compressed data which is filtered by attributes without the need to read or decompress the entire collection of data.

2. Description of the Related Art

LiDAR is an acronym for Light Detection and Ranging. As it pertains to the geospatial industry, LiDAR generally refers to an airborne, near infra-red laser that scans the surface of the earth to produce highly accurate horizontal and vertical data points that define the shape of the earth and elevations of above ground features. One benefit of LiDAR is that it can be collected either during daylight or at night. Once "raw" data has been collected, a series of semi-automated software techniques is used to clean up the data to produce a uniformly spaced set of data points that can then be used to generate accurate terrain and/or surface models. LiDAR output data is typically stored in the industry standard LAS file format. The LAS specification is published the industry consortium known as the American Society for Photogrammetry and Remote Sensing (ASPRS). The current released version of the LAS is 1.4 and contains record formats 0-10.

Typical LAS files contain from 1 million to more than 1.5 billion points. To provide a sense of magnitude for how these numbers relate to file size and data storage requirements, one must consider the parameters used when specifying LiDAR data delivery requirements. LiDAR "collects" or data collection missions are tailored to meet specifications that can be unique to a specific project. Parameters that impact output file sizes include the following: Point Density/Spacing (Refers to the relative spacing between measured points and the total number of points in a given area (typically 1 sq meter)); Multiple Returns (Multiple returns provide information pertaining to the distance to the measured surface and the return signal strength from the reflecting object.); Pulse rate (Refers to the speed at which the laser emits pulses of light. Higher pulse rates yield increased point density.); Altitude (The altitude and velocity of the aircraft directly affect the point density, field of view (size of laser spot on the ground), and pulse rate settings. Flight plans must consider air traffic control regulations and traffic conditions.).

LAS datasets are commonly used to create digital surface models, contours, intensity images, and 3D renderings for a wide range of applications. Examples include: Base Mapping & Contour Generation, Support orthorectification of aerial imagery, Floodplain Mapping, Natural Resource Management, Transportation and Utility corridor mapping, and Urban Modeling and Planning.

LAS datasets, if not cut in to manageable tiles (read gridded files) can grow to multiple terabyte sizes at full resolution and can benefit from a compressed data structure. Currently most local and state government sponsored projects use LiDAR specifications developed by the Federal Emergency Management Agency (FEMA) published in 2000. The American Society for Photogrammetry and Remote Sensing (ASPRS) is another common reference; their Guidelines for Vertical Accuracy Reporting for LiDAR Data were produced in 2004 and incorporate relevant sections of the National Digital Elevation Program's Guidelines for Digital Elevation Data. These guidelines provide recommendations for scaling data collection parameters to best match the intended application thereby saving collection costs.

While the LAS specification is helpful in standardizing data between vendors and producers, it is not particularly efficient. Its primary goal is readability of data to facilitate an easy exchange of information between subject matter experts in the geospatial domain.

An LAS file is structured to contain all "points" in series as shown in FIG. 1. It is organized in what can be called a row first format. If a point attribute is defined in the LAS Record format being used, it takes up space in the file, even if there is no information to be conveyed. There is no concept of what is commonly referred to as a null pointer. For example, the User Data field takes only one byte in each record. If there is no user data to convey, the field is typically filled with a zero value, taking one byte. If the collection has only a relatively small number of points like 10 million, that is still 10 million bytes of storage wasted.

BRIEF SUMMARY OF THE INVENTION

Various embodiments of the present invention may be advantageous in that they may solve or reduce one or more of the potential problems and/or disadvantages discussed above.

Various embodiments of the present invention may exhibit one or more of the following objects, features and/or advantages:

It is therefore a principal object and advantage of the present invention to provide a point data processing system that reduces total disc space used to store data. For example, lossless compression of 4:1 to 20:1, and in some cases up to 60:1 can be obtained. As tolerance to some data loss increases, so does compression yield. Further, lossiness can come in the form of quantization and/or rounding of selected data fields including, but not limited to: GPS time quantization/rounding/precision, X and Y quantization/rounding/precision, Z quantization/rounding/precision, and Point data ordering.

It is another object and advantage of the present invention to provide a point data processing system that provides rapid access to point data filtered by attributes without the need to read or decompress the entire collection of data. Examples of filterable point attributes include, but are not limited to: Geographic extent, Point classification, Collection time, and Point source ID.

It is further object and advantage of the present invention to provide a point data processing system that transcodes point data into the domain of data compression and retrieval.

The details of one or more embodiments are described below and in the accompanying drawings. Other objects and advantages of the present invention will in part be obvious, and in part appear hereinafter.

BRIEF DESCRIPTION OF THE SEVERAL VIEWS OF THE DRAWING(S)

The present invention will be more fully understood and appreciated by reading the following Detailed Description in conjunction with the accompanying drawings, in which:

FIG. 1 a shows an example of the structure of a LAS file;

FIG. 2 shows an example of what a point bag data structure might look like using C programming language, according to an embodiment of the present invention;

FIG. 3 illustrates an example of raw data that has not been encoded, according to an embodiment of the present invention.

FIG. 4 illustrates an example of what a run length encoded representation might look like per a run length encoding of the raw data shown in FIG. 3, according to an embodiment of the present invention;

FIG. 5 illustrates an example of a special case of run length encoding only used for encoding a single bit, where the value can only be 1 or 0, according to of an embodiment of the present invention;

Figure 11:
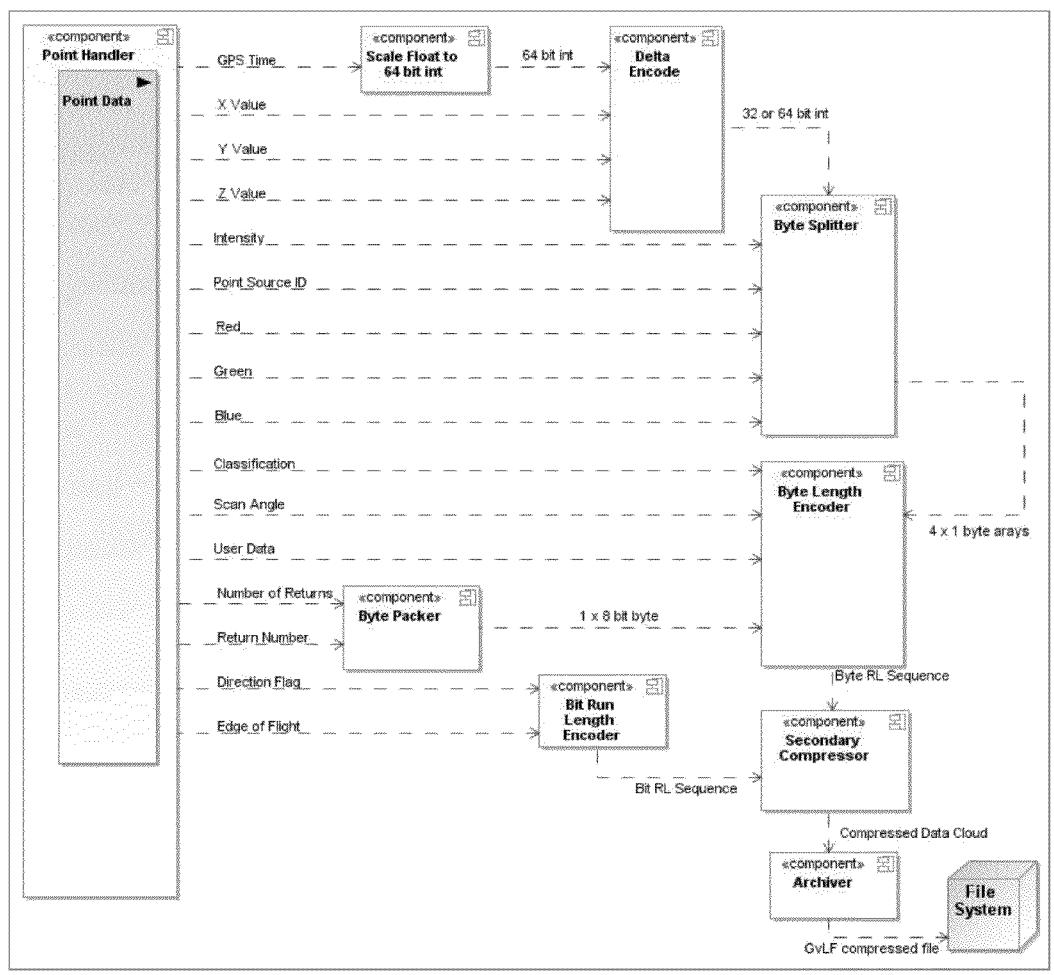

FIG. 6 provides an example of a scaling operation, according to an embodiment of the present invention;

FIG. 7 shows an example of how two nibbles of data are packed into a byte, according to an embodiment of the present invention;

FIG. 8 provides an example of run length encoding each byte position for fields individually using a 32 bit integer delta sequence, according to an embodiment of the present invention;

FIG. 9 shows the output of data in FIG. 8, according to an embodiment of the present invention;

FIG. 10 is a graphical representation of how the arrays can be organized into file components, according to an embodiment of the present invention;

FIG. 11 is a description of the overall system of preprocessing and compressing point data fields, according to an embodiment of the present invention;

DETAILED DESCRIPTION OF THE INVENTION

For purposes of the description of an embodiment of the present invention, point data record format 3 is used (see Table 1, below). However, the point data processing system of an embodiment of the present invention can be applied to all of the record types covered in the LAS specification.

TABLE 1

Point Data Record Format 3

| Item | Format | Size | Required |
|---|---|---|---|
| X | long | 4 bytes | * |
| Y | long | 4 bytes | * |
| Z | long | 4 bytes | * |
| Intensity | unsigned short | 2 bytes | |
| Return Number | 3 bits (bits 0, 1, 2) | 3 bits | * |
| Number of Returns (given pulse) | 3 bits (bits 3, 4, 5) | 3 bits | * |
| Scan Direction Flag | 1 bit (bit 6) | 1 bit | * |
| Edge of Flight Line | 1 bit (bit 7) | 1 bit | * |
| Classification | unsigned char | 1 byte | * |
| Scan Angle Rank (−90 to +90) - Left side | char | 1 byte | * |
| User Data | unsigned char | 1 byte | |
| Point Source ID | unsigned short | 2 bytes | * |
| GPS Time | double | 8 bytes | * |
| Red | unsigned short | 2 bytes | * |
| Green | unsigned short | 2 bytes | * |
| Blue | unsigned short | 2 bytes | * |

The processing performed by the point data processing system of an embodiment of the present invention can optimize each individual data field to maximize information entropy. In some cases reducing the total storage required for a field down to just a few hundred bytes, or completely eliminating storage for that field.

Rapid retrieval is accomplished by building specialized index subsets of the data. The indexes provide access to the correct location within the compressed archive to retrieve only the desired fields and only from the desired points.

Set forth below are Examples related to the structure and functionality of, and to a process associated with, a point data processing system of an embodiment of the present invention. Advantages of the invention are illustrated by the Example set forth herein. However, the particular conditions and details are to be interpreted to apply broadly in the art and should not be construed to unduly restrict or limit embodiments of the invention in any way.

EXAMPLE

Point Data Handling

In brief, a first thing this point data processing system can do is separate the information and arrange it by field. This is done iteratively in a variable number of records until all the incoming records have been processed. The field values will be collected in a data structure which can be called a point bag. This can be thought of as pivoting the data from a row first format to a column first format. Each field becomes an array of values. Only data that is non-zero is allocated any memory.

So in the case where all 16 fields in a format 3 record are populated, the point bag will have 16 arrays allocated. If only the x, y, and z fields are populated, only those fields would have array in the point bag structure. The rest would have null pointers rather than pointers to memory that has been allocated. FIG. 2 shows what a point bag data structure might look like using the C programming language.

Field Data Preprocessing

After the point handler splits the data into field arrays, each field is prepared for compression by one or more processing techniques. Each of these techniques is described in the following sections, in no particular order. The descriptions use specific point fields as examples to help illustrate the process. This should not be taken as a comprehensive list of fields that benefit from that process. Once all of the preprocessing has been described, a complete system flow is explained for all data fields.

Byte Run Length Encoding

Run Length Encoding is a form of data compression where the number of times a value is repeated is stored in place of the individual repeating values. This system can use 2 types of run length encoding. The first is used to record repeating byte sequences. The general approach for this is to write out the first occurrence of a value. If that value is immediately followed by the same value, it is written again, and then followed by the number of additional times it is repeated. If the repetition number is greater than the maximum number that can be represented by one byte (255), the original value is repeated again to indicate that an additional byte is required to hold the entire number of times the value repeats. This process is iterated as many times as necessary to hold the repetition. FIG. 3 illustrates an example of raw data that has not been encoded. The number above the bracket indicates the total number of times the number appears in that part of the sequence. Above that is the hex representation of that number.

FIG. 4 illustrates an example of what a run length encoded representation might look like per a run length encoding of the raw data shown in FIG. 3, according to an embodiment of the present invention.

Boolean Run Length Encoding

The second form of RLE is used to encode Boolean data. Since there are only two possible values for Boolean data, representing the data itself is not needed. Only the length of the sequence is needed. It can be assumed that for every new run length, the value is the negation of the previous one. It does not matter which value comes first, so TRUE can be arbitrarily assigned to be the first value in the sequence. If FALSE happens to be the first, the run length that is written out will be zero. The repeating zeros are used as a sentinel to indicate that another byte is needed for the run length. If one or more zeros appears anywhere other than at the very beginning, it indicates that more than one byte is required to encode the runlength. The number of bytes is 1+ the number of zeros. FIG. 5 illustrates an example of a special case of run length encoding only used for encoding a single bit, where the value can only be 1 or 0, according to of an embodiment of the present invention;

Delta Encoding

Delta encoding requires that only the first actual value be recorded, followed by the difference between the current value and the previous value. This is useful for fields that increment at fairly regular steps such as GPS Time, X, Y, and Z. Rather than requiring 32 or 64 bits to encode the absolute value, often the delta can be held in a single byte. Furthermore, if the delta from point to point is constant, such as time incrementing a 2 microseconds per point, the sequence can be run length encoded.

Float to Integer Scaling

Some data, such as GPS Time, may be file represents as a floating point number. In these cases, to maximize compression and avoid floating point rounding errors, all such data is scaled a 64 bit integer. The scaling factor is recorded for subsequent decoding, and all compression operations are performed on the resultant integer values. FIG. 6 provides an example of a scaling operation.

Byte Packing

Some point attributes such as the Number of Returns and Return Number can be represented in half a byte or less, and are often related to each other. In these cases it may be beneficial to pack both fields into a single byte. FIG. 7 shows an example of how two nibbles of data are packed into a byte.

Byte Splitting

The domain of point attribute values varies by attribute type. The number of bytes required ranges from 1 to 8. However, the probability that the byte's value will change from one point to the next is inversely proportional to the byte's position in the field. This means that the lowest order byte will change most often and the highest order bytes will change little if at all. This fact can be exploited by run length encoding each byte position for fields individually. Doing so for a 16 bit integer field will produce 2, one byte arrays. A 64 bit field such as those used when scaling from a floating point number to an integer will produce 8, one byte arrays. FIG. 8 provides an example using a 32 bit integer delta sequence. Although this example uses value deltas, this approach is used on any field data greater than one byte in length. This includes but is not limited to Point Source ID and Intensity. Each array of bytes is output individually, starting with the lowest order byte and ending with the highest. The output of data in FIG. 8 will appear as shown in FIG. 9.

Secondary Compression

Examples of certain generic compression techniques already exist. This effort does not try to supplant those existing compression algorithms. An embodiment of the present invention is a system of applying a novel approach to prepare the subject data for compression using any one of a number of those algorithms. This may be through the use of open source software or other sources, as should be appreciated by those skilled in the art, and will not be described here.

Archiving

Each of the data fields are processed in their own arrays. Through the processing chain they have been reduced to varying length arrays that must be stored to persistent media, or streamed over a network. The arrays are organized into a structure we will call a cloud. Clouds are indexed as described in another section of this document. The archiver component takes the individual arrays and serializes them out to a file like structure. FIG. 10 is a graphical representation of how the arrays are organized into file components. Each component is named using a three part convention. The first number in the name identifies the cloud. The second number identifies the field, and the third is an ordinal used in cases where the data array needed to be broken up into 2 or more shorter arrays for indexing purposes. Oftentimes a flight line from a collection corresponds to the Point Source ID (PSID). If the file contains points stored in flight line order, a change in PSID can be used to trigger the creation of a new cloud. Since the first component of the cloud files in the archive can be mapped to the PSID, the need to store the PSID as an array can be eliminated reducing the archive file size.

System Data Flow

FIG. 11 is used to describe the overall system of preprocessing and compressing point data fields.

Data Indexing

End user applications use point data in a variety of ways. Which fields are needed is dependent on the task being performed, often requiring only a subset of data at any one time. This system allows access any combination of fields without decompressing the unneeded ones. This is possible through the fact that each field array's location in the archive file can be stored in the file header.

If archive clouds are organized by flight line to PSID mapping, each cloud can contain just a fraction of the total extent. The system further reduces the amount of data that needs to be decompressed for any one operation through the use of an index file for each cloud. This index contains metadata describing the cloud content. It includes but is not limited to minimum and maximum GPS Time, a list of classification codes, and a list of X & Y locations describing vertices of the minimum bounding polygon. When a client asks for points to be filtered by any of these attributes, the index is used to identify the minimum set of clouds and fields to be retrieved from the archive.

Data Index Aggregation

The client has the choice of simply creating an archive file which is compressed, or placing that archive into the cloud management system (CMS). The CMS can use a relational database to make the archive's metadata readily queryable. The database index can be based on the Universal Transverse Mercator (UTM) coordinate system. The default resolution of the cloud index will be one square kilometer but is configurable. Each archive cloud can be associated with a list of 1 square KM UTM cells that it intersects. Satisfying the clients search begins with calculating the cells that intersect the area of interest, and then identifying all the clouds that intersect those cells.

As will be appreciated by one skilled in the art, aspects of the present invention may be embodied/implemented as a computer system, method or computer program product. The computer program product can have a computer processor, for example, that carries out the instructions of a computer program. Accordingly, aspects of the present invention may take the form of an entirely hardware embodiment, an entirely software embodiment or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction performance system, apparatus, or device.

The program code may perform entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Although the present invention has been described in connection with a preferred embodiment, it should be understood that modifications, alterations, and additions can be made to the invention without departing from the scope of the invention as defined by the claims.

What is claimed is:

1. A computer implemented method for reducing total storage space used to store Light Detection and Ranging (LiDAR) output data, the method comprising:
    receiving LiDAR output data containing point data information comprising a plurality of data points;
    separating and arranging the point data information, by a processor, into a plurality of fields based on predetermined parameters, wherein each field comprises an array of values;
    compressing the point data information in each field array, by said processor, by one or more data compression techniques;
    organizing and storing in a memory each compressed field array;
    storing location data in a file header of each compressed field array indicating where each compressed field array is stored in said memory;
    implementing an interface allowing access to a first subset of field arrays of a set of field arrays based on a user request, wherein said first subset of requested field arrays includes a lower number of field arrays than said set of field arrays, and
    selectively decompressing, by said processor, said first subset of requested field arrays based on said user request.

2. The computer implemented method of claim 1, further comprising the step of creating an index file, wherein said index file contains metadata describing the content of said memory.

3. The computer implemented method of claim 2, wherein said metadata includes text that is searchable.

4. The computer implemented method of claim 1, wherein said LiDAR output data is in LAS file format.

5. The computer implemented method of claim 1, wherein said one or more data compression techniques is selected from the group consisting of byte run length encoding, Boolean run length encoding, delta encoding, float to integer scaling, byte packing, and byte splitting.

6. The computer implemented method of claim 1, further comprising the step of storing each field array in a column first format.

7. A computer implemented method for reducing total storage space used to store Light Detection and Ranging (LiDAR) output data, the method comprising:
    receiving LiDAR output data containing point data information comprising a plurality of data points;
    separating and arranging the point data information, by a processor, into a plurality of fields based on predetermined parameters, wherein each field comprises an array of values;
    compressing the point data information in each field array, by said processor, by one or more data compression techniques;
    organizing and storing in a memory each compressed field array, wherein the memory is allocated to only non-zero point data information, incorporating null pointers for any non-populated fields;
    implementing an interface allowing access to a first subset of field arrays of a set of field arrays based on a user request, wherein said first subset of requested field arrays includes a lower number of field arrays than said set of field arrays, and
    selectively decompressing, by said processor, said first subset of requested field arrays based on said user request.

8. A non-transitory computer-readable storage medium containing program code comprising:
    program code for receiving Light Detection and Ranging (LiDAR) output data containing point data information comprising a plurality of data points;
    program code for separating and arranging the point data information, by a processor, into a plurality of fields based on predetermined parameters, wherein each field comprises an array of values;
    program code for compressing the point data information in each field array, by said processor, by one or more data compression techniques;
    program code for organizing and storing in a memory each compressed field array;
    program code for storing location data in a file header of each compressed field array indicating where each compressed field array is stored in said memory;
    program code for organizing and storing in a memory each compressed field array;
    program code for storing location data in a file header of each compressed field array indicating where each compressed field array is stored in said memory;
    program code for implementing an interface allowing access to a first subset of field arrays of a set of field arrays based on a user request, wherein said first subset of requested field arrays includes a lower number of field arrays than said set of field arrays, and program code for selectively decompressing, by said processor, said first subset of requested field arrays based on said user request.

9. The non-transitory computer-readable storage medium of claim 8, further comprising program code for creating an index file, wherein said index file contains metadata describing the content of said memory.

10. The non-transitory computer-readable storage medium of claim 9, wherein said metadata includes text that is searchable.

11. The non-transitory computer-readable storage medium of claim 8, wherein said LiDAR output data is in LAS file format.

12. The non-transitory computer-readable storage medium of claim 8, wherein said one or more data compression techniques is selected from the group consisting of byte run length encoding, Boolean run length encoding, delta encoding, float to integer scaling, byte packing, and byte splitting.

13. The non-transitory computer-readable storage medium of claim 8, further comprising program code for storing each field array is in a column first format.

14. A non-transitory computer-readable storage medium containing program code comprising:

program code for receiving Light Detection and Ranging (LiDAR) output data containing point data information comprising a plurality of data points;

program code for separating and arranging the point data information, by a processor, into a plurality of fields based on predetermined parameters, wherein each field comprises an array of values;

program code for compressing the point data information in each field array, by said processor, by one or more data compression techniques;

program code for organizing and storing in a memory each compressed field array, wherein the memory is allocated to only non-zero point data information, incorporating null pointers for any non-populated fields;

program code for implementing an interface allowing access to a first subset of field arrays of a set of field arrays based on a user request, wherein said first subset of requested field arrays includes a lower number of field arrays than said set of field arrays, and program code for selectively decompressing, by said processor, said first subset of requested field arrays based on said user request.

* * * * *